United States Patent [19]

Hashimoto

[11] Patent Number: 5,339,343
[45] Date of Patent: Aug. 16, 1994

[54] COUNTER CIRCUIT WITH OR GATES INTERCONNECTING STAGES TO PROVIDE ALTERNATE TESTING OF ODD AND EVEN STAGES DURING TEST MODE

[75] Inventor: Yoshinori Hashimoto, Nara, Japan

[73] Assignee: Sharp Kabushiki Kaisha, Osaka, Japan

[21] Appl. No.: 886,389

[22] Filed: May 21, 1992

[30] Foreign Application Priority Data

May 29, 1991 [JP] Japan .................. 3-126043

[51] Int. Cl.5 .............................................. H03K 21/40
[52] U.S. Cl. ............................................ 377/29; 377/55; 377/116
[58] Field of Search ................. 377/29, 116, 55, 28

[56] References Cited

U.S. PATENT DOCUMENTS

| | | | |
|---|---|---|---|
| 3,588,475 | 6/1971 | Scott | 377/116 |
| 3,798,354 | 3/1974 | Sadlak | 377/116 |
| 4,733,405 | 3/1988 | Shimizume et al. | 377/29 |
| 4,979,193 | 12/1990 | Mehta | 377/29 |
| 4,991,186 | 2/1991 | Payen et al. | 377/28 |
| 5,185,769 | 2/1993 | Wang | 377/29 |

FOREIGN PATENT DOCUMENTS 3122579  5/1989  Japan .
 269022  3/1990  Japan .

Primary Examiner—John S. Heyman

[57] ABSTRACT

A counter circuit includes a plurality of one-bit counters connected in series. The counter circuit includes first and second input terminals which are supplied with a predetermined signal, respectively, in an operational test mode. The counter circuit further includes a unit for alternately supplying a carry signal to a carry signal input of each one-bit counter in series when the predetermined signals are applied thereto. The unit may be composed of a plurality of OR circuits. Each OR circuit is provided with one input connected to the carry signal output of a one-bit counter at the preceding stage of the series, the other input connected to either the first input terminal or the second input terminal, and an output connected to the one-bit counter at the next stage.

5 Claims, 3 Drawing Sheets

COUNTER CIRCUIT WITH OR GATES INTERCONNECTING STAGES TO PROVIDE ALTERNATE TESTING OF ODD AND EVEN STAGES DURING TEST MODE

BACKGROUND OF THE INVENTION

1. Field of the Invention

The present invention relates to a counter circuit including a plurality of one-bit counters. More particularly, it relates to a counter circuit with an operational test function.

2. Description of the Related Art

In a conventional counter circuit which comprises a plurality of one-bit counters and has a test function, serial test data is input and the binary digits of the data are written in the respective one-bit counters. Further, the binary counts of the respective one-bit counters can be read out as serial data. Specific numeric values are written in the respective counters, and after the counters finish their counting operations, the binary counts of the counters are read out to check, from those counts, whether the counting operations could be performed normally.

FIG. 3 shows an example of such a conventional counter circuit. This is a four-bit counter circuit comprising four one-bit counters corresponding to the number of bits of the binary count. The counter circuit includes serial data control lines, a serial data input line and a serial data output line.

A counter input signal is input commonly to the clock input terminals CK of the respective counters as a clock signal for shifting data. A carry signal output terminal Y of each counter is connected to a carry signal input terminal A of the next stage. Note that a high level signal is input to the terminal A of the counter 31. An output terminal Q of each counter is connected to a data input terminal DIN of the next-stage counter. The data input terminal DIN of the counter 31 is an input terminal of serial data. A serial data control signal is input commonly to a control terminal SCAN of each counter. When this control signal goes to the high level, this counter circuit operates in the same manner as a shift register. More specifically, serial data applied to the data input terminal DIN of the counter 31 is input each time a counter input signal (clock signal) is input, and passes through the counters 31 to 34, and is output from the output terminal.

When this counter circuit is tested, the one-bit counters 31 to 34 are tested one after another. Each time one of the counters is tested, serial data needs to be input and output. As for the number of clock signals to be input to the counter circuit, if the number of bits of the counter circuit is N (N=4 in the example of FIG. 3), it is necessary to provide N clock pulses for input to one counter, a clock pulse for a counting operation, and N clock pulses for output of the serial data. Therefore, the total number of clock pulses is $2N+1$. This applies to each one-bit counter, so that the total number of clock pulses is $(2N+1)N$, hence, $2^2+N$. If the number of counting operations conducted to improve the reliability of the test is I, the total number of clock pulses is $2N^2+IN$.

As described above, with the conventional counter circuit, input and output operations of serial data are required for every test of each one-bit counter. Therefore, the total number of clock pulses necessary for a test is proportional to the square of the number of bits of the counter circuit. For this reason, the time required for a test is also proportional to the square of the number of bits. Thus, as the number of bits of a counter circuit increases, the time necessary for a test becomes quite long. The reliability of a test varies with a combination of data written into each one-bit counter. Therefore, improving the reliability of the test with the combination of data will require a longer test time.

SUMMARY OF THE INVENTION

It is therefore an object of the present invention to provide a counter circuit which requires a greatly reduced time for an operational test.

According to the present invention, a counter circuit is formed by connecting a plurality of one-bit counters in series. The counter circuit comprises first and second input terminals which are supplied with a predetermined signal respectively in an operational test mode, and a unit for alternately supplying a carry signal to a carry signal input of each one-bit counter in series when the predetermined signals are applied thereto.

In a preferred embodiment the supplying unit includes a plurality of OR circuits with one input connected to a carry signal output terminal of the one-bit counter at the preceding stage of the series, the other input connected to either the first input terminal or the second terminal, and an output terminal connected to the one-bit counter at the next stage.

When a first test signal with specified level is applied to the first input terminal, the logic levels of carry input signals are fixed, which are output by the OR circuits of a first group that receive the test signal. Therefore, the logic levels of carry input signals of the one-bit counters connected to those OR circuits are fixed. Under this condition, a counter input signal is supplied to the one-bit counters to make them perform counting operations, and then a specified control signal and counter input signals, as many in number as the number of bits, are given so that counting output signals of the respective counters are shifted to the end of the counter circuit in a serial manner and obtained as serial data. By checking the logic levels of the data, it can be ascertained whether the counters operated correctly. At this time, the OR circuits of a second group, other than those of the first group, transmit supplied carry output signals to the counters of the next bits as carry input signals. Therefore, it can be ascertained whether or not the carry output signals output from the one-bit counters connected to the OR circuits of the first group could be supplied correctly to the next-stage one-bit counters.

Likewise, when a second test signal at a specified level is applied to the second input terminal, the logic levels of carry input signals output from the OR circuits of the second group are fixed. Therefore, the logic levels of the carry input signals of the one-bit counters connected to those OR circuits are fixed. Under this condition, a counter input signal is supplied to cause counting operations to be performed. Then, a specified control signal and counter input signals, as many in number as the number of bits, are input so that the counting output signals of the respective counters are shifted to the end of the counter circuit in a serial manner and obtained as serial data. By checking the logic levels of the data, it can be ascertained whether the counters operated correctly. At this time, since the OR circuits of the first group supply received carry output signals to the counters of the next bits as carry input signals, it can be ascertained whether or not the carry output signals output by the one-bit counters connected to the OR circuits of the second group could be supplied correctly to the next-stage one-bit counters.

Therefore, in the counter circuit according to the present invention, by inputting the first or second test signal via the first and second input terminal, respectively, a plurality of one-bit counters can be divided into two groups. Thus, it is not necessary to repeat a test on each of the one-bit counters, as many times in number as the number of bits, as has been done conventionally. Therefore, the number of clock pulses required to conduct a test is simply proportional to the number of bits of the counter circuit, and the number of clocks to be supplied can be made far smaller than in a conventional test in which the total number of clock pulses required is proportional to the square of the number of bits of the one-bit counter. Thus, the time required for test can be reduced greatly.

Further objects and advantages of the present invention will be apparent from the following description of the preferred embodiments of the invention as illustrated in the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Description will now be made of the preferred embodiment of the present invention.

Figure 1:
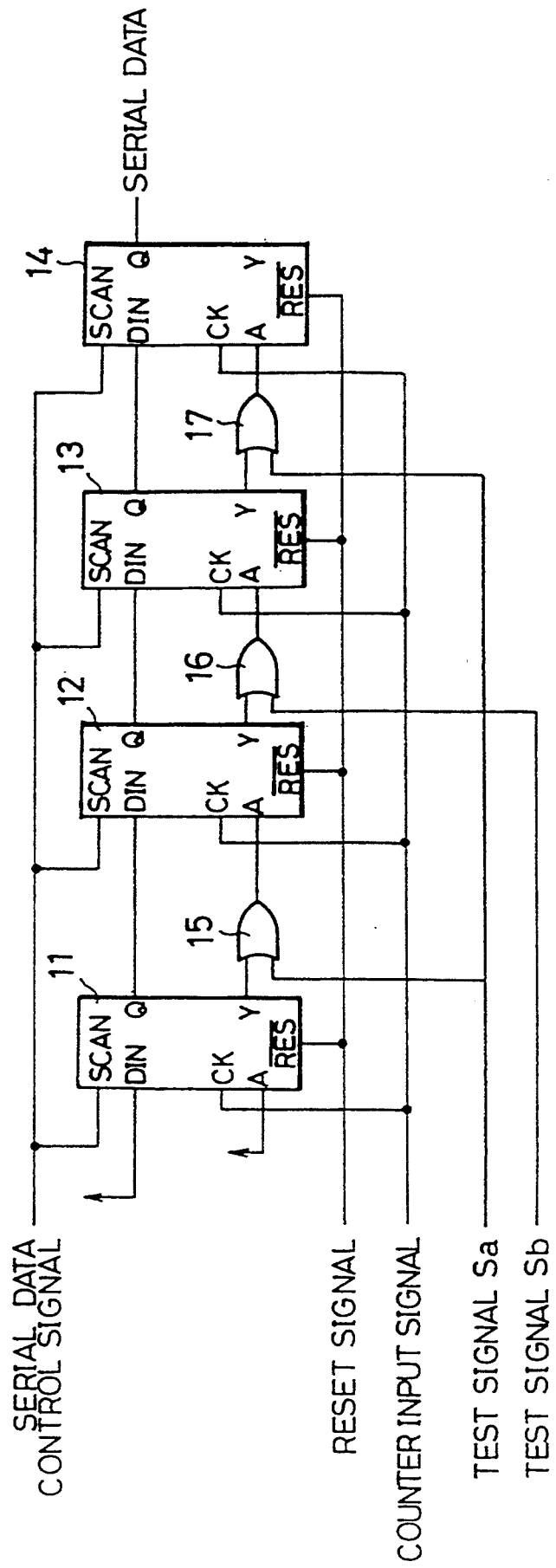
FIG. 1 is a block diagram showing a preferred embodiment of the counter circuit according to the present invention.

FIG. 1 shows a block diagram of a preferred embodiment of the counter circuit according to the present invention. This is a four-bit counter circuit comprising four one-bit counters 11 to 14 corresponding to the number of bits of the binary count. A clock signal, a serial data control signal and a reset signal are input commonly to the clock input terminals, control terminals SCAN, and reset terminals RES($-$) of the respective counters.

In FIG. 1, reference numerals 15, 16 and 17 denote OR circuits having input terminals thereof on the one hand respectively connected to carry signal output terminals Y of one-bit counters 11, 12 and 13, output terminals thereof connected respectively to carry signal input terminals A of one-bit counters 12, 13 and 14. A test signal Sa is input to the other input terminals of the OR circuits 15 and 17 that receive carry output signals from the counters 11 and 13 corresponding to odd-number bits of a binary count of the counter circuit. Further, a test signal Sb is input to an input terminal, on the other side of the OR circuit 16 that receives a carry output signal from the counter 12 corresponding to an even-number bit of the binary count of the counter circuit. A high-level signal is input to the terminal A of the counter 11.

Output terminals Q of the counters 11 to 13 are connected to data input terminals DIN of the next-stage counters 12 to 14, respectively, and a high-level signal is input to the data input terminal DIN of the counter 11.

Figure 2:
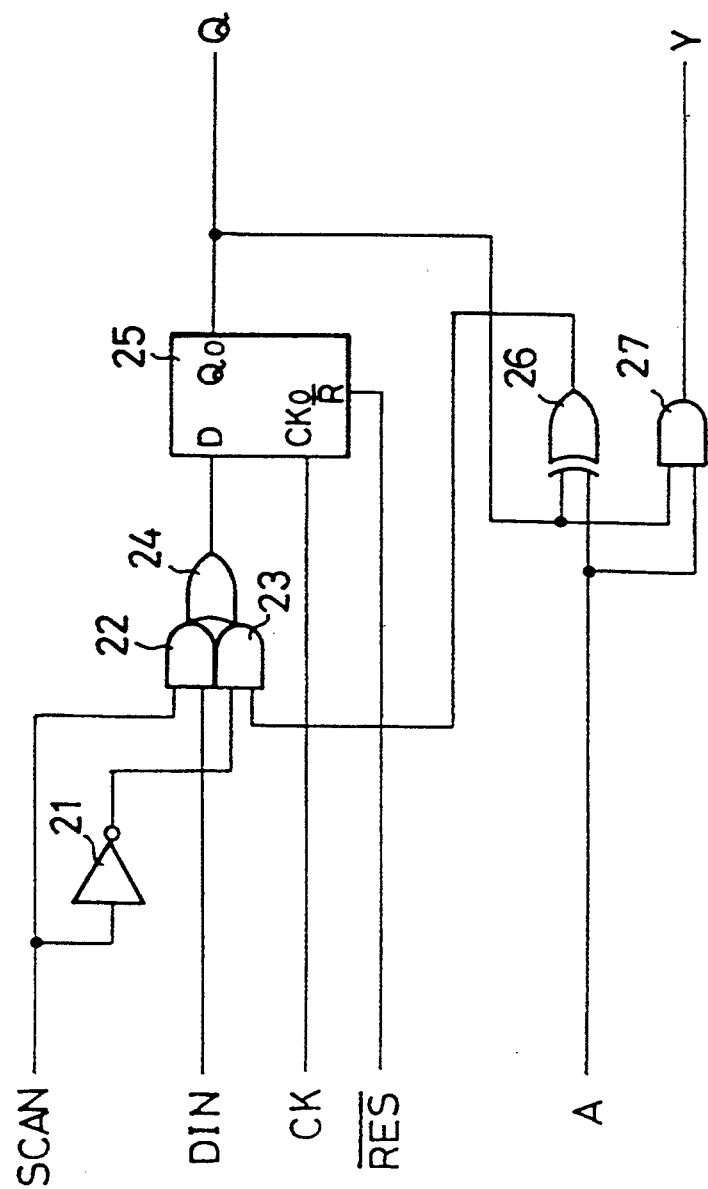
FIG. 2 is a detailed block diagram showing a one-bit counter as a component element of the counter circuit of FIG. 1.
Figure 3:
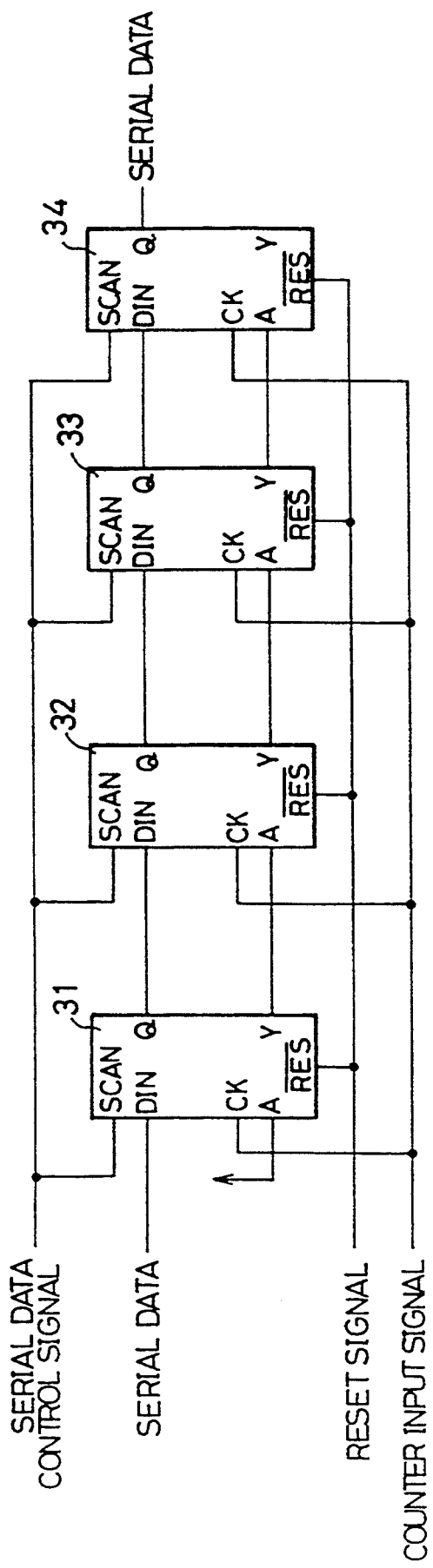
FIG. 3 is a block diagram of a conventional counter circuit.

FIG. 2 is a circuit diagram showing a detailed arrangement of each of the one-bit counters 11 to 14.

In FIG. 2, reference numeral 25 denotes a D flip-flop, in which the clock input terminal $CK_0$ is connected to the clock input terminal CK of this one-bit counter. The output terminal $Q_0$ is connected to the output terminal Q, and the reset terminal R($-$) is connected to the reset terminal RES($-$). One input terminal of OR circuit 22 is connected to the control terminal SCAN of the one-bit counter, while the other input terminal of the OR circuit 22 is connected to the serial data input terminal DIN. The input terminal of the inverter circuit 21 is connected to the terminal SCAN, and the output terminal to the other input terminal of OR circuit 23. The output terminals of the OR circuits 22 and 23 are connected to the two terminals of an OR circuit 24, respectively, and the output terminal of the OR circuit 24 is connected to the data input terminal D of the flip-flop 25. Input terminals, on the one hand, of exclusive OR circuit 26 and OR circuit 27 are both connected to the output terminal $Q_0$ of the flip-flop 25, while the other input terminals are both connected to the carry signal input terminal A of the one-bit counter. The output terminal of the exclusive OR circuit 26 is connected to the other input terminal of the OR circuit 23, while the output terminal of the OR circuit 27 is connected to the carry signal output terminal Y of the one-bit counter.

A truth table of the one-bit counter arranged as described can be easily derived $Q_n$ and $Q_{n+1}$ respectively indicate the states of the output signal before and after a counter input signal is input. The letter L denotes the low level, while the letter H denotes the high level.

Description will now be made of the test procedure and the operation of the parts when a test is conducted on the counter circuit shown in FIG. 1.

(1) The test signal Sa is set at the high level, and the test signal Sb at the low level. Consequently, outputs of the OR circuits 15 and 17 are at the high level, so that high-level carry signals are constantly applied to the terminals A of the one-bit counters 12 and 14. More specifically, high-level carry signals are input to the one-bit counters 12 and 14 regardless of carry signals output by the one-bit counters 11 and 13.

(2) A pulse of counter input signal is input. By this signal, the one-bit counters 11 to 14 perform counting operations.

(3) The serial data control signal is put to the high level to make the counter circuit operate like a shift register.

(4) The counter input signal is input as many times in number as the number of bits of the counter circuit, namely, four times. As a result, binary counts of all one-bit counters 11 to 14 are read out, and by the counts read out, it is ascertained whether or not the counters performed counting operations correctly.

(5) The procedures (1) to (4) are repeated by specifying 2, 3 and 4 as the number of times of inputting a counter input signal in the procedure (2).

(6) The procedures (1) to (5) by setting the test signal Sa at the low level and the test signal Sb at the high level.

By executing the procedures (1) to (6), the test of the counter circuit is completed. It ought to be noted that in the test in which the test signal Sa is at the high level and the test signal Sb is at the low level, since the carry signal output by the counter 12 is input to the counter 13 through the OR circuit 16, it can be ascertained whether or not the carry signal can be supplied from the counter 12 to the counter 13. On the other hand, in the test in which the test signal Sa is at the low level and the test signal Sb is at the high level, carry signals output by the counters 11 and 13 are input to the counters 12 and 14 through the OR circuits 15 and 17. Therefore, it is possible to ascertain whether carry signals can be supplied from the counters 11 and 13 to the counters 12 and 14.

If the number of bits of the counter circuit is denoted by N (N=4 in the counter circuit in FIG. 1), the number of clock pulses to be input in this test is N+1 in the procedures (1) to (4), N+2 in the procedures (1) to (4) for the second time, N+3 for the third time, and N+4 for the fourth time. Therefore, the total number of clock pulses is 4N+10 when the procedure (5) is completed. As the procedures (1) to (5) are executed again in the procedure (6), the total number of clock pulses is (4N+10)×2=8N+20. In other words, the total number of clock pulses is merely proportional to the number of bits of the counter circuit. Therefore, the number of clock pulses required is much smaller than a conventional test in which the total number is proportional to the square of the number of bits, so that time required for test is shortened substantially. In addition, this invention obviates the need to improve the reliability of the test by writing various items of data as has been done conventionally. This further decreases the time required for the test.

In this embodiment, a high-level signal is input to the data input terminal DIN of the one-bit counter 11. However, it is also possible to preserve the same function of inputting serial data to the input terminal DIN as in the prior-art counter circuit.

In this embodiment, one test signal is input to a one-bit counter, but such an arrangement may be made to input a test signal to a plurality of one-bit counters.

Many widely varied embodiments of the present invention may be constructed without departing from the spirit and the scope of the present invention, which is not limited to the specific embodiments described in the specification. Such variations are not to be regarded as a departure from the spirit and scope of the invention, and all such modifications as would be obvious to one skilled in the art are intended to be included within the scope of the appended claims.

What is claimed is:

1. An N-bit counter circuit comprising:

N stages, each including a one-bit counter having a data input, a carry input, a data output, and a carry output, said N stages being connected in series with each other such that the data output of each one-bit counter at each of the N stages is connected with the data input of the next one-bit counter at the next stage, and such that the data output of the one-bit counter at the last stage is connected with an output of said N-bit counter circuit;

(N−1) input OR gates, each connected exclusively between two one-bit counters which are located adjacent to each other, one input of the n-th OR gate being connected with the carry output of the n-th one-bit counter, an output of the n-th OR gate being connected with the carry input of the (n+1)-th one-bit counter;

a first test signal input, connected with other inputs of odd numbered OR gates, for receiving a first predetermined test signal; and a second test signal input, connected with other inputs of even numbered OR gates, for receiving a second predetermined test signal.

2. A method of operating an N-bit counter including N stages, each having a one-bit counter to test functions of the N-bit counter, each one-bit counter having a data input, a carry input, a data output, a carry output, a clock input and a serial data control input, the N stages being connected in series with each other such that the data output of each one-bit counter at each stage is connected with the data input of the next one-bit counter at the next stage, and such that the data output of the one-bit counter at the last stage is connected with an output of the N-bit counter circuit, said method comprising the steps of:

(a) applying, constantly, a carry signal to the carry inputs of one-bit counters at either the even or odd numbered stages;
    (b) applying a clock pulse to the clock inputs of all the one-bit counters so that all the counters begin to count;
    (c) applying a serial data control signal to the serial data control inputs of all the one-bit counters so that all the counters are set to act as a shift register;
    (d) applying N clock pulses to the clock inputs of all the one-bit counters so that count values of all the counters are serially read out of the data output of the one-bit counter at the last stage;
    (e) applying two clock pulses to the clock inputs of all the one-bit counters and repeating the steps (c) and (d);
    (f) applying three clock pulses to the clock inputs of all the one-bit counters and repeating the steps (c) and (d);
    (g) applying four clock pulses to the clock inputs of all the one-bit counters and repeating the steps (c) and (d);
    (h) applying, constantly, a carry signal to the carry inputs of the other of the even and odd numbered one-bit counters to which no carry signal was applied in the step (a); and
    (i) repeating the steps (b)-(g).

3. A method according to claim 2, wherein said step (a) comprises applying, constantly, a carry signal to the carry inputs of one-bit counters at the even or odd numbered stages in response to a first predetermined test signal, and said step (h) comprises applying, constantly, a carry signal to the carry inputs of the other of the even and odd numbered one-bit counters to which no carry signal was applied in the step (a) in response to a second predetermined test signal.

4. A method according to claim 3 further comprising the step of:

applying, respectively, high level logic signals to the data input and the carry input of the one-bit counter at the first stage in advance of the step (a).

5. A method according to claim 3 further comprising the step of:

applying a high level logic signal to the carry input of the one-bit counter at the first stage and applying a serial data to the data input of the one-bit counter at the first stage in advance of the step (a).

* * * * *